United States Patent

Halamek et al.

[11] Patent Number: 5,912,558
[45] Date of Patent: Jun. 15, 1999

[54] AUTOMATIC FREQUENCY TUNING FOR MR SCANNERS

[75] Inventors: James A. Halamek, Independence; Mark J. Loncar, Richmond Heights; Heidi A. Schlitt, Chesterland, all of Ohio

[73] Assignee: Picker International, Inc., Highland Heights, Ohio

[21] Appl. No.: 08/970,261

[22] Filed: Nov. 14, 1997

[51] Int. Cl.$^6$ .................................................. G01V 3/00
[52] U.S. Cl. ............................................ 324/313; 324/322
[58] Field of Search .................................. 324/313, 314, 324/318, 322, 307, 309, 300

[56] References Cited

U.S. PATENT DOCUMENTS

| | | | |
|---|---|---|---|
| 4,602,213 | 7/1986 | Sugiura | 324/307 |
| 4,763,074 | 8/1988 | Fox | 324/322 |
| 4,806,866 | 2/1989 | Maier | 324/313 |
| 5,309,102 | 5/1994 | Deckard | 324/314 |
| 5,565,779 | 10/1996 | Arakawa et al. | 324/322 |
| 5,594,338 | 1/1997 | Magnuson | 324/318 |

OTHER PUBLICATIONS

Numerical Recipes, Second Ed., W. H. Press, S. A. Teukolsky, W. T. Vetterling, B. P. Flannery, Section 14.8, pp. 644–649, 1992.

*Primary Examiner*—Louis Arana
*Attorney, Agent, or Firm*—Fay, Sharpe, Beall, Fagan, Minnich & Mckee, LLP

[57] ABSTRACT

A method (100) of automatically tuning a radio frequency transmitter (24) and receiver (38) in a magnetic resonance imaging apparatus to an optimum frequency includes generating and acquiring (104) a magnetic resonance signal. The magnetic resonance signal is transformed to the frequency domain and spectral magnitude of the signal is computed (106). A center of gravity interpolation is performed (110) on the spectral magnitude to obtain a desired frequency sampling. A model function is generated based upon a strength of a main magnetic field which has peaks separated by the same separation as that for fat and water signals. The spectral magnitude is correlated (112) with the model function and a peak having the greatest magnitude is located therefrom. The location of a species peak along the spectral magnitude is estimated (114) from empirically derived information, the strength of the main magnetic field and the location of the correlation peak. A region of the spectral magnitude to be examined is defined (116) from empirically derived information, and a peak within this region is located (118) which is nearest the estimated location. Ultimately, the frequency of the radio frequency transmitter and receiver is set (122) to align with the peak located within the region that is nearest the estimated location.

17 Claims, 3 Drawing Sheets

AUTOMATIC FREQUENCY TUNING FOR MR SCANNERS

BACKGROUND OF THE INVENTION

The present invention relates to the magnetic resonance arts. It finds particular application in conjunction with automatic tuning of radio frequency transmitters and receivers in MR imaging systems and will be described with particular reference thereto. It is to be appreciated, however, that the invention will also find application in spectroscopy and other processes and apparatus in which transmitters and receivers are automatically tuned for optimum performance.

In magnetic resonance imaging, a uniform magnetic field is created through an examination region in which a subject being examined is disposed. A series of radio frequency pulses and magnetic field gradients are applied to the examination region. Typically, an RF coil disposed about the examination region is driven by a transmitter to excite magnetic resonance in dipoles disposed within the examination region. Via the same RF coil or alternately a separate receive-only coil, magnetic resonance signals generated by relaxing dipoles are received by a digital receiver. The magnetic resonance signals are then processed to generate two or three dimensional image representations of a portion of the subject in the examination region.

Prior to running each separate magnetic resonance scan, the frequency of the transmitter and receiver are set to the appropriate Larmor frequency such that the desired species is excited. Generally, water and/or fat molecules are largely responsible for the production of the magnetic resonance signals. The Larmor frequency of these two species is different, and for each the optimum frequency varies from patient to patient and/or from location to location within the same patient due to various inhomogeneities.

In the past, the frequency setting was accomplished either manually or automatically. In the case of manual setting, a magnetic resonance signal was generated and received such that an operator viewing a spectral magnitude of the signal could manually adjust the frequency of the transmitter and receiver to align with the signal peaks corresponding to either the Larmor frequency for fat, water, or other desired species or other particular frequency depending upon the scan to be run. This manual method is time consuming and the accuracy of the results depend on the training level and ability of the operator.

In previous automatic techniques, the frequency of the transmitter and receiver is set by performing a correlation between a spectral magnitude of the received magnetic resonance signal and a model spectrum. The method employed a two-stage process. In the first stage, a broad band signal is acquired and used to set a course frequency. In the second stage, a narrower band signal is employed and the spectral magnitude of the received magnetic resonance signal therefrom is compared with the model spectrum. This technique for automatically setting the frequency fails to account for the fact that the received signal is a function of the frequency of the transmitter. As the frequency is changed, the nature of the received signal can change. Further, no attempt is made to verify that the predicted frequency of the transmitter actually produces the desired change in the signal.

The present application contemplates a new and improved method for automatically setting the optimum frequency of a radio frequency transmitter and receiver in a magnetic resonance imaging apparatus which overcomes the above-referenced problems and others.

SUMMARY OF THE INVENTION

In accordance with one aspect of the present invention, a method for automatically tuning a radio frequency transmitter and receiver in a magnetic resonance imaging apparatus to an optimum frequency is provided. The method includes generating and acquiring a magnetic resonance signal. The magnetic resonance signal is then transformed into the frequency domain and a spectral magnitude of the magnetic resonance signal is computed. A center of gravity interpolation is performed on the spectral magnitude to obtain a desired frequency sampling. A model function is generated based on a strength of an applied main magnetic field within the examination region which has peaks separated by a separation equal to that for fat and water signals. The spectral magnitude is correlated with the model function and a peak thereof having the greatest magnitude is located. From empirically derived information, the strength of the main magnetic field, and the location of the correlation peak, a location of a species peak along the spectral magnitude is estimated. A region of the spectral magnitude to be examined is defined from empirically derived information. A peak within the region of the spectral magnitude to be examined is located which is nearest to the estimated location of the species peak. The frequency of the radio frequency transmitter and receiver is then set to be aligned with the peak located nearest the estimated location of the species peak.

In accordance with a more limited aspect of the present invention, estimating the location of the species peak includes estimating the location of one of a water peak, a fat peak, and a silicon peak along the spectral magnitude.

In accordance with a more limited aspect of the present invention, after computing the spectral magnitude, the spectral magnitude is filtered.

In accordance with a more limited aspect of the present invention, filtering the spectral magnitude is accomplished by employing one of a low pass filter and an adaptive edge preserving noise reduction filter which reduces noise peaks while leaving important features of the spectral magnitude unchanged.

In accordance with a more limited aspect of the present invention, the method further includes the step of repeating the previous steps while monitoring the set transmitter and receiver frequency until the set transmitter and receiver frequency varies from the set transmitter and receiver frequency in the repetition just prior to the current repetition by less than a predetermined amount.

In accordance with a more limited aspect of the present invention, the repetition is terminated and a flag is set if the repetitions exceed a predetermined number.

In accordance with a more limited aspect of the present invention, the predetermined number is 10.

In accordance with a more limited aspect of the present invention, the predetermined amount is in the range of 10–20 hertz.

In accordance with a more limited aspect of the present invention, when no peaks are located within the region of the spectral magnitude to be examined which are nearest the estimated location of the species peak, the frequency of the radio frequency transmitter and receiver is set to align with the estimated location.

In accordance with another aspect of the present invention, a magnetic resonance imaging apparatus is provided which includes a main magnet for generating a main magnetic field through an examination region. A gradient coil assembly for generating magnetic gradients across the examination region and a RF coil assembly position about the examination region such that it excites magnetic resonance in dipoles disposed therein and receives magnetic resonance signals from the resonating dipoles is also included. A radio frequency transmitter drives the RF coil assembly and a receiver connected to the RF coil assembly receives and demodulates the magnetic resonance signals for a reconstruction processor which reconstructs an image representation to display on a human-readable display. A computerized control system initiates and carries out a prescan routine for automatically tuning the radio frequency transmitter and the receiver to an optimum frequency. The computerized control system has a signal processor for acquiring a prescan magnetic resonance signal from the receiver, transforming it to a frequency domaing and generating a spectral magnitude thereof. A central processing unit preforms a center-of-gravity interpolation on the spectral magnitude, correlates it with a model function designed to detect peaks having the same separation as fat and water signals, locates a maximum peak of the correlation, estimates a location of a peak associated with a particular species, defines a search window around the estimated location, and sets the radio frequency transmitter and the receiver to align with a peak located along the spectral magnitude within the search window which is nearest to the estimated location.

In accordance with a more limited aspect of the present invention, the particular species is chosen from the group consisting of water, fat, and silicon.

In accordance with a more limited aspect of the present invention, the computerized control system also includes a filter arranged such that after the signal processor generates the spectral magnitude, the spectral magnitude is filtered to reduce unwanted noise prior to the central processing unit preforming the center of gravity interpolation.

In accordance with a more limited aspect of the present invention, the filter is selected from the group consisting of a low pass filter and an adaptive edge preserving noise reduction filter.

In accordance with a more limited aspect of the present invention, the computerized control system repeats the prescan routine a plurality of time until the radio frequency transmitter and the receiver are set within a predetermined tolerance. The computerized control system also includes a counter arranged to count how many times the prescan routine is run and if the prescan routine is run more than a predetermined number of times a flag is set and the prescan routine is no longer repeated.

In accordance with a more limited aspect of the present invention, the predetermined tolerance is the difference between set frequencies of the radio frequency transmitter and the receiver for successive prescan routines and is in the range of 10 to 20 Hz.

In accordance with a more limited aspect of the present invention, the predetermined number of times is 10.

In accordance with another aspect of the present invention, a computerized control system is provided in a magnetic resonance imaging apparatus. The magnetic resonance imaging apparatus has a main magnet which generates a main magnetic field through an examination region, a gradient coil assembly which generates magnetic gradients across the examination region, a RF coil assembly position about the examination region such that it excites magnetic resonance in dipoles disposed therein and receives magnetic resonance signals from the resonating dipoles, a radio frequency transmitter which drives the RF coil assembly, a receiver connected to the RF coil assembly which receives and demodulates the magnetic resonance signals, and a reconstruction processor which reconstructs an image representation for display on a human-readable display from the received magnetic resonance signals. The computerized control system initiates and carries out a prescan routine for automatically tuning the radio frequency transmitter and the receiver to an optimum frequency. The computerized control includes a signal processor which acquires a prescan magnetic resonance signal from the receiver, transforms it to a frequency domain, and generates a spectral magnitude thereof and a central processing unit. The CPU preforms a center-of-gravity interpolation on the spectral magnitude, correlates it with a model function designed to detect peaks having the same separation as fat and water signals, locates a maximum peak of the correlations estimates a location of a peak associated with a particular species, defines a search window around the estimated location, and sets the radio frequency transmitter and the receiver to align with a peak located along the spectral magnitude within the search window which is nearest to the estimated location.

One advantage of the present invention is that it precisely and accurately sets the transmitter and receiver frequency to an optimum Larmor frequency.

Another advantage of the present invention is that the transmitter and receiver are automatically tuned thereby eliminating misalignment of the transmitter and receiver frequency with the optimum Larmor frequency due to operator error.

Another advantage of the present invention is that it accounts for the functional relationship between the transmitter frequency and the acquired magnetic resonance signal.

Another advantage of the present invention is that it allows for a wide variety of magnetic resonance acquisition techniques to be used in acquiring the signal.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
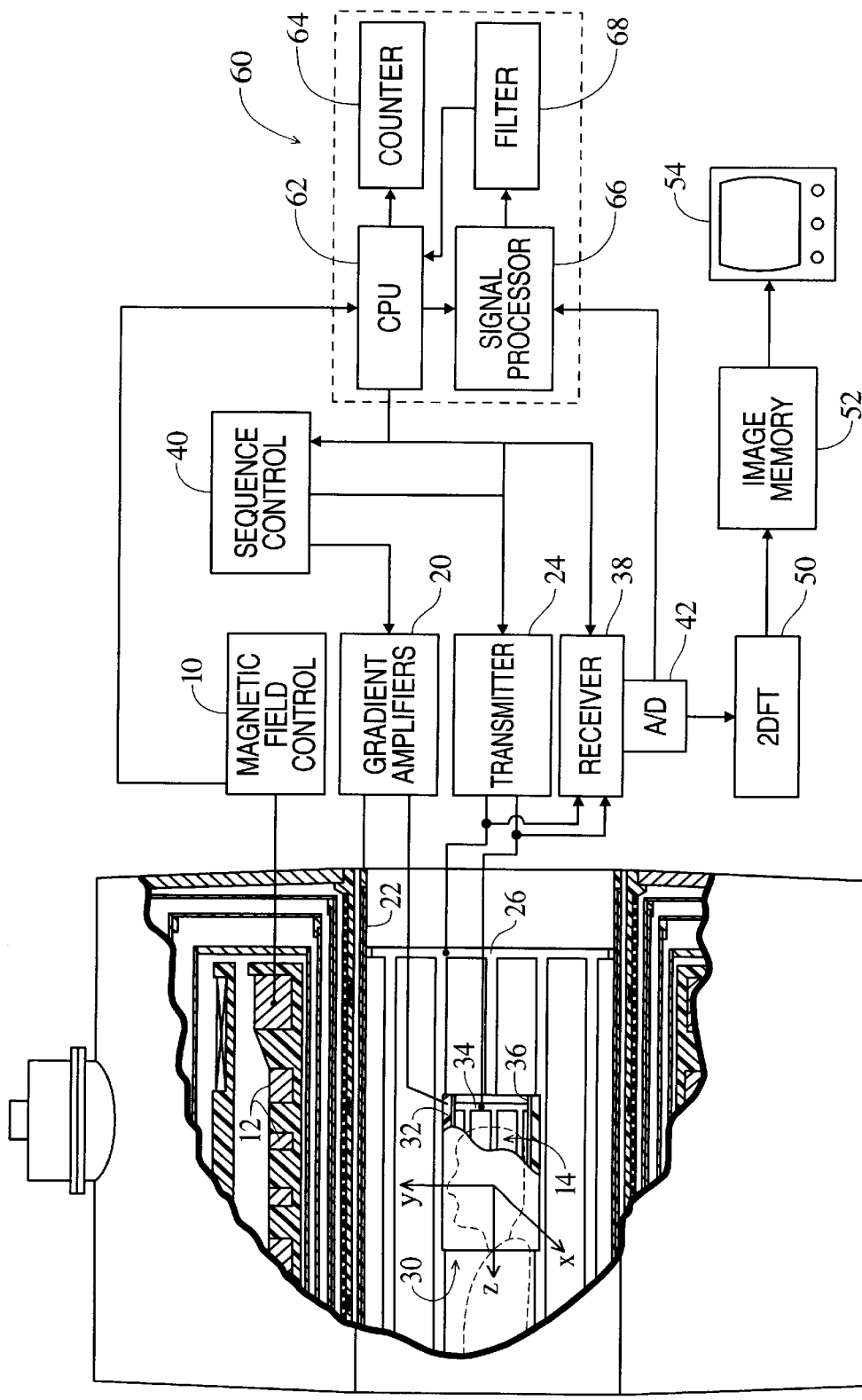
FIG. 1 is a diagrammatic illustration of a magnetic resonance imaging apparatus employing the automatic tuning method in accordance with the present invention.

With reference to FIG. 1, a main magnetic field control 10 controls superconducting or resistive magnets 12 such that a substantially uniform, temporally constant main magnetic field is created along a z axis through an examination region 14. A magnetic resonance echo means applies a series of radio frequency (RF) and magnetic field gradient pulses to invert or excite magnetic spins, induce magnetic resonance, refocus magnetic resonances manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y and z-axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole body RF coil 26.

For generating images of limited regions of the subject local coils are commonly place contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used to receive resonance signals introduced by body-coil RF transmissions. An RF screen 36 blocks the RF signals from the RF head coil from inducing any currents in the gradient coils and the surrounding structures. The resultant radio frequency signals are picked up by the whole body RF coil 26, the local RF coil 34, or other specialized RF coils and demodulated by a receiver 38, preferably a digital receiver.

A sequence control circuit 40 controls the gradient pulse amplifiers 20 and the transmitter 24 to generate any of a plurality of multiple echo sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter is disposed between the radio frequency receiving coil and the receiver for digital receivers and is disposed down stream (as illustrated) from the receiver for analog receivers. Ultimately, the radio frequency signals received are demodulated and reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display, such as a video monitor 54 which provides a man-readable display of the resultant image.

Figure 2:
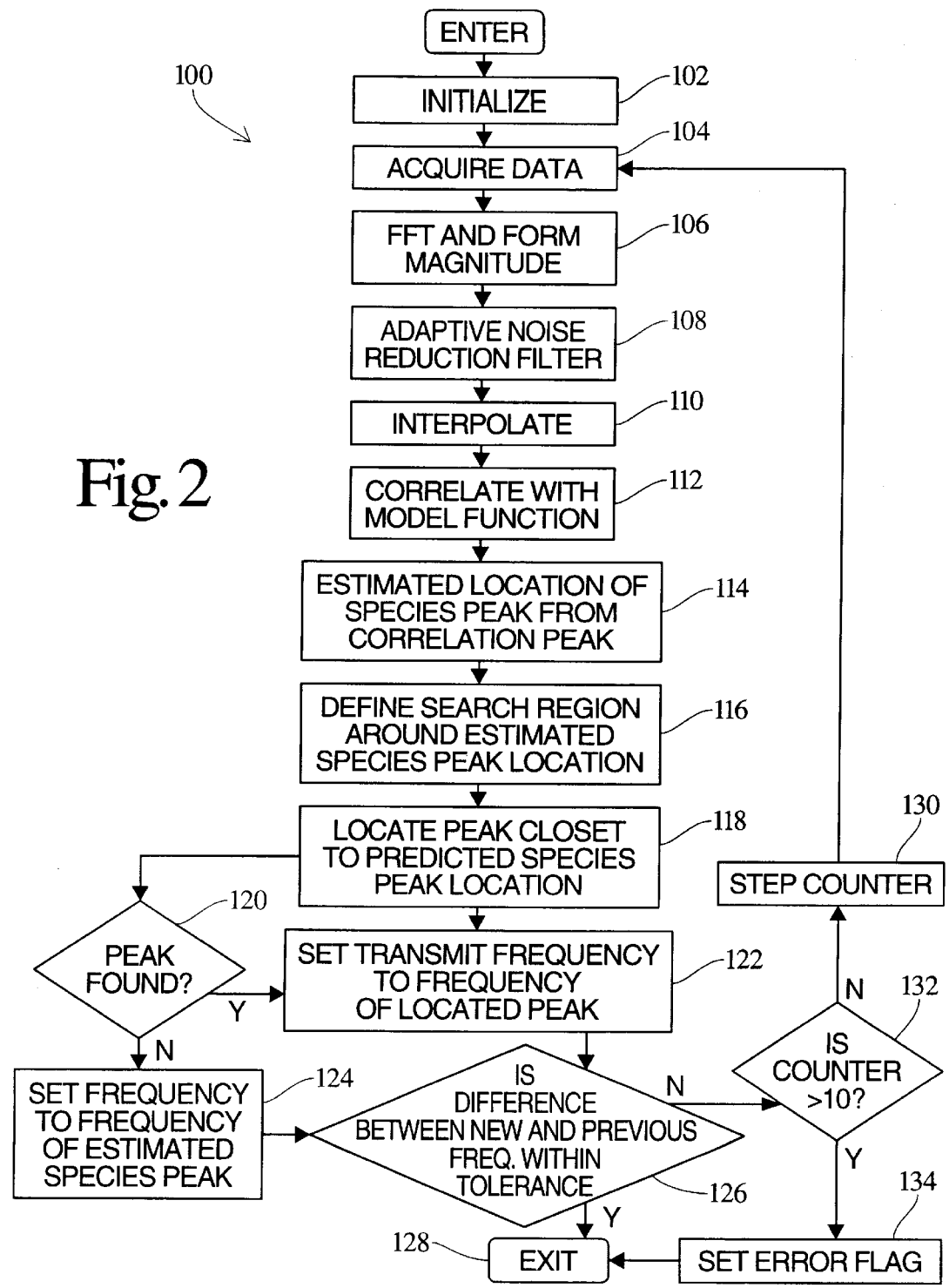
FIG. 2 is a flow chart illustrating the method of automatically tuning a radio frequency transmitter and receiver in accordance with the present invention.

With reference to FIG. 2 and continuing reference to FIG. 1, prior to each magnetic resonance scan a computerized control system 60 including a central processing unit 62 runs a prescan routine 100 which prepares the magnetic resonance imaging system for the upcoming scan. Along with setting the other usual system parameters, the prescan routine automatically tunes the transmitter 24 and receiver 38 to the optimum Larmor frequency for the species being excited in the magnetic resonance imaging scan.

The automatic tuning of the transmitter 24 and receiver 38 is begun by setting a counter 64 to a predetermined or input initial value, preferably 1, and setting the transmitter 24 and receiver 38 to a predetermined or input frequency in the vicinity of the desired Larmor frequency as indicated in box 102 as the initialization step. Next, the computerized control system causes a magnetic resonance signal to be generated in the usual manner. The signal is then acquired 104 by way of the receiver 38.

A signal processor 66 using a fast Fourier transformation transforms the signal into the frequency domain and a spectral magnitude (similar to those shown in FIGS. 3*a* and 3*b*) of the transformed signal is computed as shown in box 106. The spectral magnitude is then fed back to the CPU 62 through an optional filter 68 as shown in box 108. Filter 68, alternately, may include a low-pass filter or an adaptive edge preserving noise reduction filter which leaves the important features of the spectral magnitude unchanged while reducing unwanted noise peaks. One such suitable adaptive filter has been disclosed in "Numerical Recipes," Second Edition, by W. H. Press, published in 1992, Section 14.8, pp 644–649.

In order to obtain a desired frequency sampling, a center-of-gravity interpolation is performed on the spectral magnitude as shown in box 110. The spectral magnitude is then correlated with a model function as shown in box 112. The model function is computed to detect peaks having the same separation as that for fat and water signals independent of any measured magnitudes and/or widths of the fat and water peaks. The model is a function of the field strength of the main magnetic field. The CPU 62 monitors the magnetic field control 10 to obtain information regarding the field strength of the main magnetic field. After locating the maximum peak of the correlation function, the location of a species peak along the spectral magnitude is estimated using empirically derived information, the field strength of the main magnetic field, and the location of the correlation function's peak as shown in box 114. Species peaks to which the frequency is tuned may be predetermined or input and include one of fat peaks, water peaks, silicon peaks, and other appropriate species peaks. As shown in box 116, from empirically derived information, a region of the spectral magnitude about the estimated species location is calculated. This region defines the range of the spectral magnitude which will be examined. As shown in box 118, the range of the spectral magnitude which is to be examined is searched for a signal peak which lies closest to the estimated peak location. If a peak is found 120, then the frequency of the transmitter and receiver are set to align therewith 122, and if no peak is found 120, they are set to align with the estimated value 124.

Figure 3A:
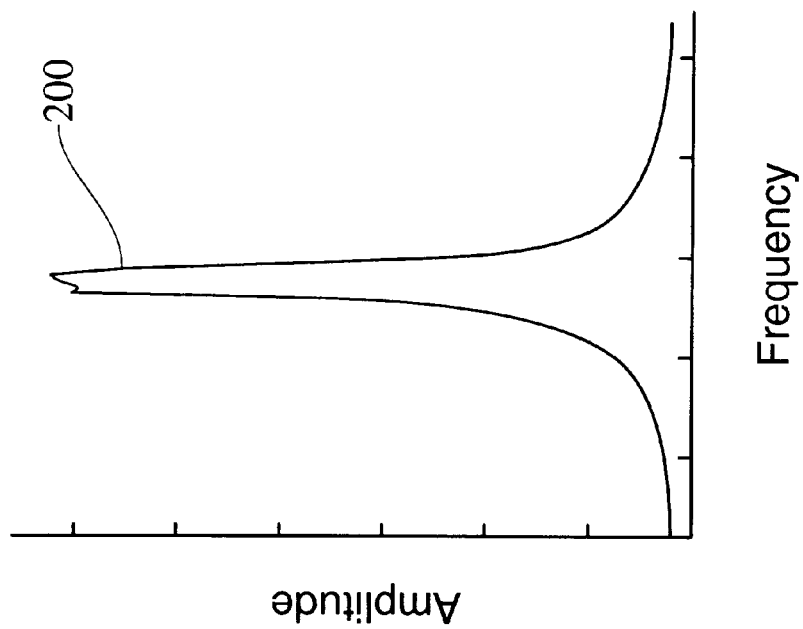
FIGS. 3a and 3b are exemplary illustrations for showing the change in a spectral magnitude as a center frequency is varied.
Figure 3B:
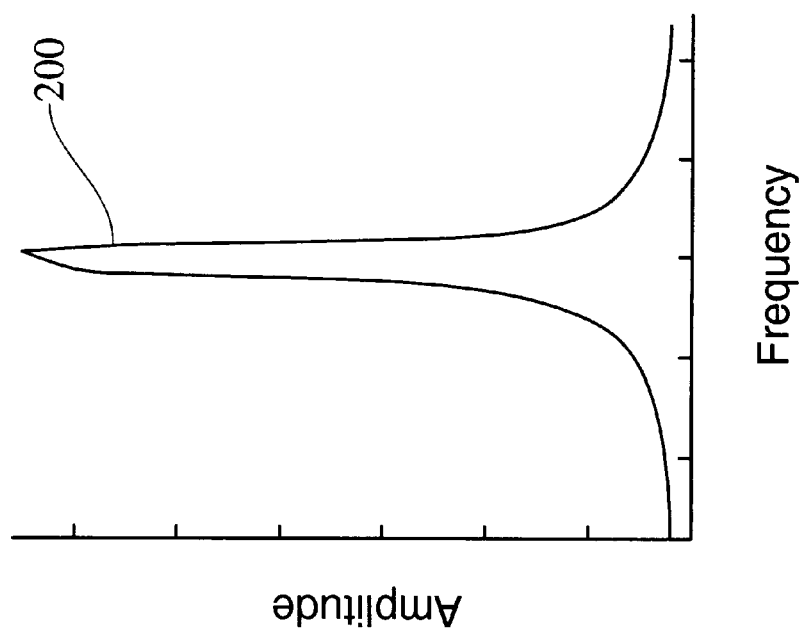

Next, as shown in box 126, a comparison is made between the new set frequency of the transmitter and receiver with the frequency from the previous prescan run. If the difference between the two is within a predetermined tolerance, preferably 10–20 hertz, the prescan routine exits 128 and the magnetic resonance imaging scan is commenced with the transmitter and receiver set to the optimum Larmor frequency. If the difference falls outside the predetermined tolerance, the prescan routine is rerun at the new frequency and the counter is increased by 1 130. In this way, the computerized control system zeroes in on the optimum Larmor frequency. The loop or repetitions continue until the frequency is within the given tolerance or the number of repetitions as monitored by the counter 64 exceeds a predetermined cut-off limit, preferably 10 repetitions 132. If the cut-off limit is reached, an error flag is set 132 indicating that the computerized control system did not set the transmitter and receiver to an appropriate frequency within the given tolerance parameters. The multiple repetitions are advantageous in that as the frequency of the transmitter and receiver is changed, the spectral magnitude 200 of the received signal also undergoes change as shown in FIGS. 3a and 3b. Therefore, the multiple repetitions allow the computerized control system to zero in and focus on the optimum Larmor frequency while taking into account changes in the spectral magnitude 200 of the received signal that result from changing the frequency.

While applicants' invention herein has been illustrated in conjunction with a solenoid-type magnetic resonance imaging apparatus, it is to be appreciated that applicants invention herein is also contemplated for use with other magnetic resonance imaging apparatus types such as those having open geometries often referred to as C-shaped main magnets and others known in the art as well as spectroscopy applications. Other variations are also contemplated. For example, while the counter 64 has been presented as being initially set at 1 and being stepped up with each repetition, it is equally feasible to set the counter 64 at 10 and count down the number of repetitions.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of automatically tuning a radio frequency transmitter and receiver in a magnetic resonance apparatus to an optimum frequency comprising:
    (a) generating a magnetic resonance signal;
    (b) acquiring the magnetic resonance signal;
    (c) transforming the magnetic resonance signal to the frequency domain;
    (d) computing a spectral magnitude of the magnetic resonance signal;
    (e) preforming a center of gravity interpolation on the spectral magnitude to obtain a desired frequency sampling;
    (f) generating a model function based on a strength of a main magnetic field which has peaks separated by a separation equal to that for fat and water signals;
    (g) correlating the spectral magnitude within the desired frequency sampling with the model function;
    (h) locating a peak of the correlation having the greatest magnitude;
    (i) estimating a location of a species peak along the spectral magnitude from empirically derived information, the strength of the main magnetic field, and the location of the correlation peak;
    (j) defining a region of the spectral magnitude to be examined from empirically derived information;
    (k) locating a peak in the spectral magnitude which is within the region of the spectral magnitude to be examined and which is nearest the estimated location of the species peak; and,
    (l) setting the frequency of the radio frequency transmitter and receiver to align with the peak located in step (k).

2. The method of claim 1, wherein the step of estimating the location of the species peak includes:
    estimating the location of one of a water peak, a fat peak, and a silicon peak along the spectral magnitude.

3. The method of claim 1, further including after the step of computing the spectral magnitude:
    filtering the spectral magnitude.

4. The method of claim 3, wherein the step of filtering the spectral magnitude includes:
    employing one of a low pass filter and an adaptive edge preserving noise reduction filter which reduces noise peaks while leaving important features of the spectral magnitude unchanged.

5. The method of claim 1, further including the following steps:
    (m) repeating steps (a) through (l) while monitoring the set transmitter and receiver frequency until the set transmitter and receiver frequency varies from the set transmitter and receiver frequency in the repetition just prior to the current repetition by less than a predetermined amount.

6. The method of claim 5, wherein the step of repeating step (a) through (l) is terminated and a flag is set if the repetitions exceed a predetermined number.

7. The method of claim 6, wherein the predetermined number is 10.

8. The method of claim 5, wherein the predetermined amount is in the range of 10 to 20 Hz.

9. The method of claim 1, wherein when no peak is located in step (k), step (l) is skipped and the frequency of the radio frequency transmitter and receiver is set to align with the estimated location of step (i).

10. A magnetic resonance imaging apparatus comprising:
    a main magnet which generates a main magnetic field through an examination region;
    a gradient coil assembly which generates magnetic gradients across the examination region;
    a RF coil assembly position about the examination region such that it excites magnetic resonance in dipoles disposed therein and receives magnetic resonance signals from the resonating dipoles;
    a radio frequency transmitter which drives the RF coil assembly;
    a receiver connected to the RF coil assembly which receives and demodulates the magnetic resonance signals;
    a reconstruction processor which reconstructs an image representation for display on a human-readable display from the received magnetic resonance signals; and,
    a computerized control system which initiates and carries out a prescan routine for automatically tuning the radio frequency transmitter and the receiver to an optimum frequency, the computerized control system including:
        a signal processor which acquires a prescan magnetic resonance signal from the receiver, transforms it to a frequency domain, and generates a spectral magnitude thereof; and,
        a central processing unit which preforms a center-of-gravity interpolation on the spectral magnitude, correlates it with a model function designed to detect peaks having the same separation as fat and water signals, locates a maximum peak of the correlation, estimates a location of a peak associated with a particular species, defines a search window around the estimated location, and sets the radio frequency transmitter and the receiver to align with a peak located along the spectral magnitude within the search window which is nearest to the estimated location.

11. The magnetic resonance imaging apparatus of claim 10, wherein the particular species is chosen from the group consisting of water, fat, and silicon.

12. The magnetic resonance imaging apparatus of claim 10, wherein the computerized control system further includes:
   a filter arranged such that after the signal processor generates the spectral magnitude, the spectral magnitude is filtered to reduce unwanted noise prior to the central processing unit preforming the center of gravity interpolation.

13. The magnetic resonance imaging apparatus of claim 12, wherein the filter is selected from the group consisting of a low pass filter and an adaptive edge preserving noise reduction filter.

14. The magnetic resonance imaging apparatus of claim 10, wherein the computerized control system repeats the prescan routine a plurality of time until the radio frequency transmitter and the receiver are set within a predetermined tolerance and further includes:
   a counter arranged to count how many times the prescan routine is run and if the prescan routine is run more than a predetermined number of times a flag is set and the prescan routine is no longer repeated.

15. The magnetic resonance imaging apparatus of claim 14, wherein the predetermined tolerance is the difference between set frequencies of the radio frequency transmitter and the receiver for successive prescan routines and is in the range of 10 to 20 Hz.

16. The magnetic resonance imaging apparatus of claim 14, wherein the predetermined number of times is 10.

17. In a magnetic resonance imaging apparatus having a main magnet which generates a main magnetic field through an examination region, a gradient coil assembly which generates magnetic gradients across the examination region, a RF coil assembly position about the examination region such that it excites magnetic resonance in dipoles disposed therein and receives magnetic resonance signals from the resonating dipoles, a radio frequency transmitter which drives the RF coil assembly, a receiver connected to the RF coil assembly which receives and demodulates the magnetic resonance signals, and a reconstruction processor which reconstructs an image representation for display on a human-readable display from the received magnetic resonance signals, a computerized control system which initiates and carries out a prescan routine for automatically tuning the radio frequency transmitter and the receiver to an optimum frequency, the computerized control system including:
   a signal processor which acquires a prescan magnetic resonance signal from the receiver, transforms it to a frequency domain, and generates a spectral magnitude thereof; and,
   a central processing unit which preforms a center-of-gravity interpolation on the spectral magnitude, correlates it with a model function designed to detect peaks having the same separation as fat and water signals, locates a maximum peak of the correlation, estimates a location of a peak associated with a particular species, defines a search window around the estimated location, and sets the radio frequency transmitter and the receiver to align with a peak located along the spectral magnitude within the search window which is nearest to the estimated location.

* * * * *